United States Patent [19]
Lyden et al.

[11] Patent Number: 5,986,595
[45] Date of Patent: Nov. 16, 1999

[54] REDUCTION OF MISMATCH ERRORS FOR MULTIBIT OVERSAMPLED DATA CONVERTERS

[75] Inventors: Colin Lyden, Co. Cork; Aidan Keady, Co. Galway, both of Ireland

[73] Assignee: University College Cork, Ireland

[21] Appl. No.: 08/810,950

[22] Filed: Feb. 27, 1997

[30] Foreign Application Priority Data

Feb. 28, 1996 [IE] Ireland .................................. S960171

[51] Int. Cl.⁶ .................................................. H03M 1/06
[52] U.S. Cl. ......................... 341/118; 341/120; 341/143; 341/144; 341/145
[58] Field of Search ..................... 341/118, 120, 341/143, 144, 145

[56] References Cited

U.S. PATENT DOCUMENTS

| | | | |
|---|---|---|---|
| 5,406,283 | 4/1995 | Leung | 341/143 |
| 5,642,116 | 6/1997 | Gersbach | 341/120 |
| 5,666,118 | 9/1997 | Gersbach | 341/120 |
| 5,684,482 | 11/1997 | Galton | 341/144 |

*Primary Examiner*—Howard L. Williams
*Assistant Examiner*—Jason L. W. Kost
*Attorney, Agent, or Firm*—Rossi & Associates

[57] ABSTRACT

Mismatch errors within oversampled analog to digital (ADC) and digital to analog (DAC) data converters limit the overall conversion accuracy. A circuit is provided which interchanges the analog segments within a multibit oversampled converter in a fashion to move the mismatch errors away from the overall converter's passband frequencies and towards other frequencies where they do not interfere with the signal to be converted. The circuit works by minimizing the differences in the signals which control the individual segments. Circuits may be provided for achieving first, second and higher order "shaping" of the mismatch errors. The invention also provides a circuit in which exchange of the analog elements with the DACs of multibit oversampled converters is effected using a circular queue, so moving the mismatch errors to high frequency where they do not interfere with the signal to be converted.

2 Claims, 8 Drawing Sheets

REDUCTION OF MISMATCH ERRORS FOR MULTIBIT OVERSAMPLED DATA CONVERTERS

BACKGROUND OF THE INVENTION

1. Field of the Invention

This invention relates to data conversion. The invention is particularly directed to analog to digital converters (ADC) and digital to analog converters (DAC). The invention is especially directed to the minimisation of error in data converters of these kinds.

2. Description of the Prior Art

Multibit oversampled analog to digital (ADC) and digital to analog (DAC) data converters are an attractive alternative to their single bit counterparts because of their reduced quantisation error and the relative ease of achieving loop operation which is stable and free of spurious tones. Recent work on sigma delta ($\Sigma\Delta$) oversampled data converters has shown how averaging techniques can be used to extend the overall accuracy beyond the limits set by process-induced mismatch between the analog segments in the multibit converter. These averaging schemes in effect "noise-shape" the mismatch error away from the passband of interest. The effect of this noise shaping is illustrated qualitatively in FIGS. 1 and 2. FIG. 1 shows, on a plot of signal amplitude against frequency, the effect of segment mismatch errors, which result in harmonics of the signal to be converted being erroneously added to the passband of the converter. FIG. 2 shows the desired noise shaping effect, where the errors have been moved to a higher frequency and no longer interfere with the signal passband.

More recently, second order shaping of the mismatch error has been described, in which a multi-strand sigma delta ($\Sigma\Delta$) loop is employed to noise-shape a vector of quantisation errors. Each strand of the loop controls a segment in the multibit DAC and applies a noise-shaping filter to its component of the quantisation error vector.

The term "noise-shaping" in the sigma-delta converter art has been used in reference to increasing the sampling rate to move the quantisation error signal away from the frequency of interest. In the present specification, the term "noise-shaping" is also applied to techniques directed to overcoming the impact of errors arising out of manufacturing tolerances in the components of sigma-delta systems, and is to be understood accordingly.

BRIEF SUMMARY OF THE INVENTION

These known circuits for achieving noise shaping of the DAC mismatch error are quite complex. It is an object of the invention to provide improved methods and circuitry for effecting a reduction in mismatch errors in noise shaping techniques for data conversion arrangements.

According to the invention, there is provided a data conversion system comprising a segmented digital to analog converter for converting digital input data to an analog output over a predetermined frequency range, the segmented digital to analog converter having a plurality of digital to analog sub-converters each responsive to a respective segment control signal, and the system further comprising means for displacing error signals arising from mismatch between the digital to analog sub-converters to a frequency outside said predetermined frequency range, wherein said error signal displacing means comprises a plurality of filter arrangements, each associated with a respective one of said digital to analog sub-converters, and the input to each filter arrangement is a respective segment control signal for the associated said digital to analog sub-converter, the outputs from said filter arrangements providing a plurality of inputs to a segment selector for setting said segment control signals.

The data conversion system of the invention may comprise a digital to analog converter, or alternatively, the invention may define an analog to digital conversion system wherein said digital to analog converter defines an analog feedback path.

BRIEF DESCRIPTION OF THE DRAWINGS

The invention will now be described in more detail having regard to the accompanying drawings, in which.

DETAILED DESCRIPTION OF THE INVENTION

Figure 1:
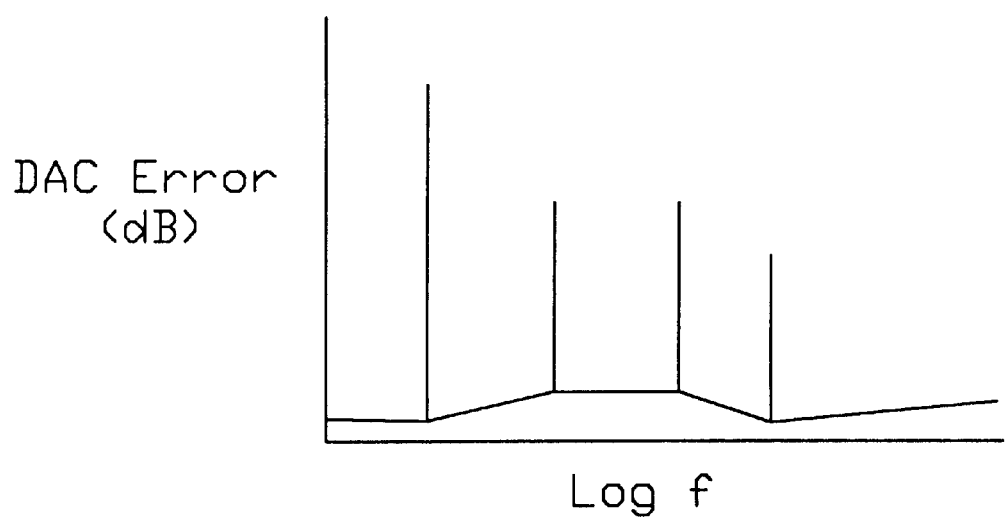
FIG. 1 shows the effect of segment mismatch errors in a known construction of DAC converter using known conversion methods.
Figure 2:
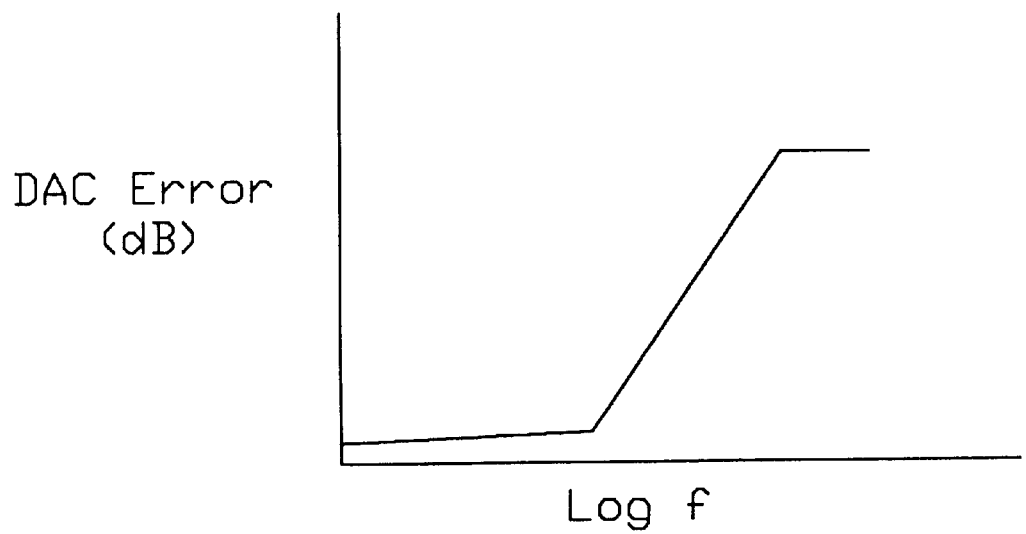
FIG. 2 shows a desired noise shaping effect, with errors moved to a higher frequency.
Figure 3:
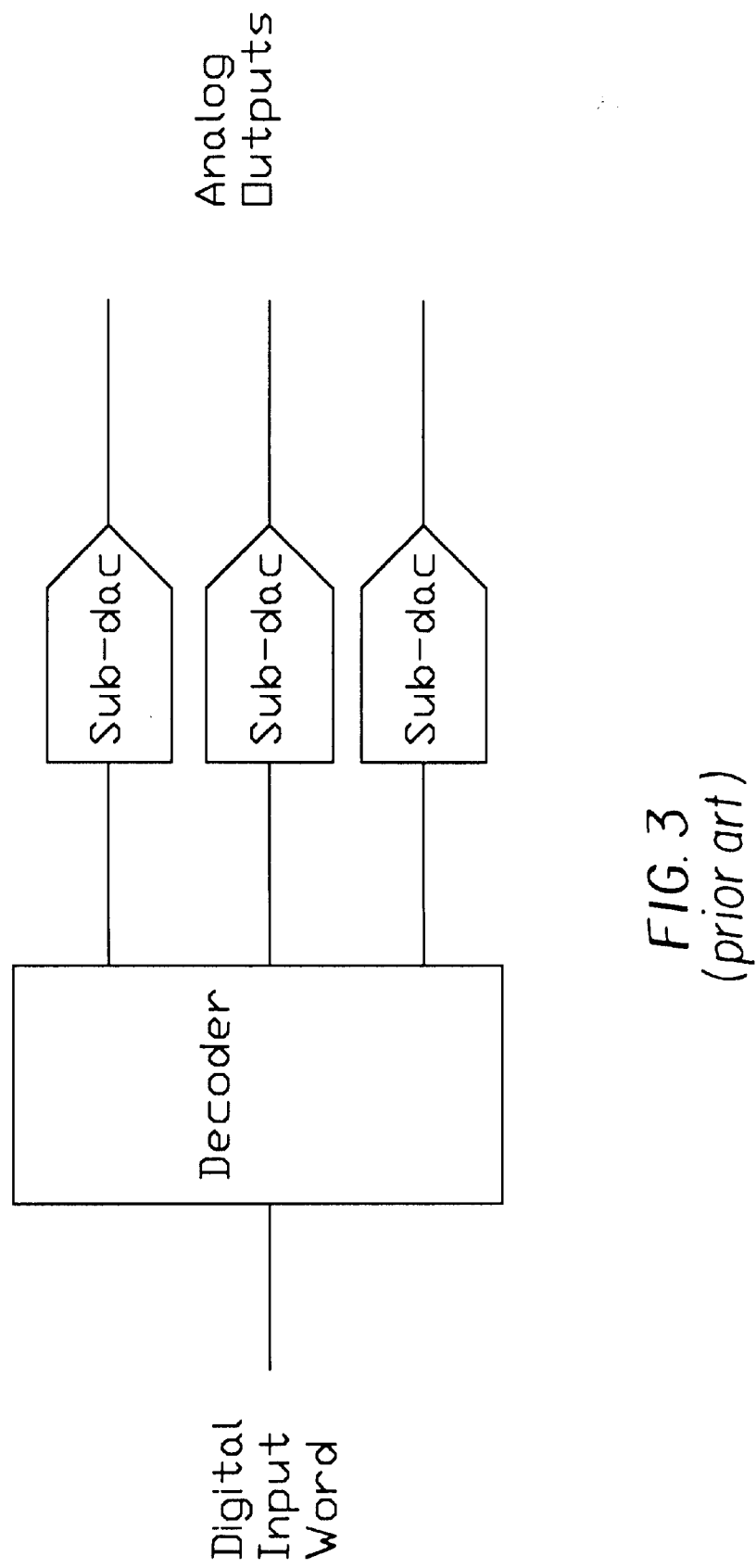
FIG. 3 shows a known construction of multibit DAC.

DAC errors arise in multibit oversampled data conversion in the following manner. Within a multibit oversampled data converter, there is a multibit DAC. If the overall converter is an ADC, then this DAC will provide an analog feedback path. If the overall converter is a DAC, then this DAC will feed into an analog filter at the output of the overall converter. A segmented DAC, such as would be used within a multibit oversampled data converter, is illustrated in FIG. 3. The input to the circuit is a digital word, typically coming from the quantiser in the oversampled converter. Each bit in the input word controls a segment. Each segment consists of a one bit sub-DAC. In general, the outputs of the sub-DACs are summed together at the input to a filter in some other part of the overall converter. In an ideal circuit, the segments would be identical to each other. However, manufacturing tolerances lead to a slight mismatch between the segments, which in turn causes the analog DAC output to be an imperfect representation of the digital input word. In such a segmented multibit DAC, the total error due to the segment mismatch is a weighted sum of the individual segment errors:

$$\text{Error} = \Sigma K_i \cdot S_i \qquad (1)$$

where $K_i$ are the individual segment mismatch errors, i.e. the difference between the individual and the ideal segment values and $S_i$ are the single bit signals controlling the segments. It is normal practice to calibrate the overall data converter so that the individual mismatch terms sum to zero, thus:

$$\Sigma K_i = 0 \qquad (2)$$

From observations of equations (1) and (2), the total error is zero whenever the $S_i$ segment control signals are identically equal to each other. If the $S_i$ are constrained to be equal at all times, then the DAC reverts to single bit rather than multibit operation. It is desirable instead to have a circuit which minimises the DAC (by minimising the differences in $S_i$) at selected frequencies only. This possibility provides the basis for the present invention, in which there is described a "noise shaping" circuit which minimises the differences between the $S_i$ in the passband frequencies of the overall data converter, the term "noise-shaping" being used in this text in the sense already defined above. The noise-shaping circuit of the invention does not minimise the differences between the $S_i$, at frequencies for instance outside of the passband. In a particular embodiment, the noise shaping circuit of the invention allows larger differences between the $S_i$ at higher frequencies, where the corresponding errors will not interfere with the signal to be converted.

Thus the insight provided by the present invention is use of all sub-DACs in the same proportion over time, to thereby make the "K" factor constant. By prescribing that the sum of the sub-errors must equate to 0, comparable proportionate use of each sub-DAC over time follows, in order to achieve the required noise shaping or displacement of harmonics to frequencies outside the passband of interest for the filter. The filters are chosen to have highest gain at the frequencies where it is desired to have best matching of sub-DAC usage. It may be noted that random use of sub-DACs does not achieve the required result, in that while a noise characteristic is achieved which is largely uniform across the entire frequency spectrum, the required displacement of the noise signals to the higher frequency region away from the passband of relevance is not achieved.

Figure 4:
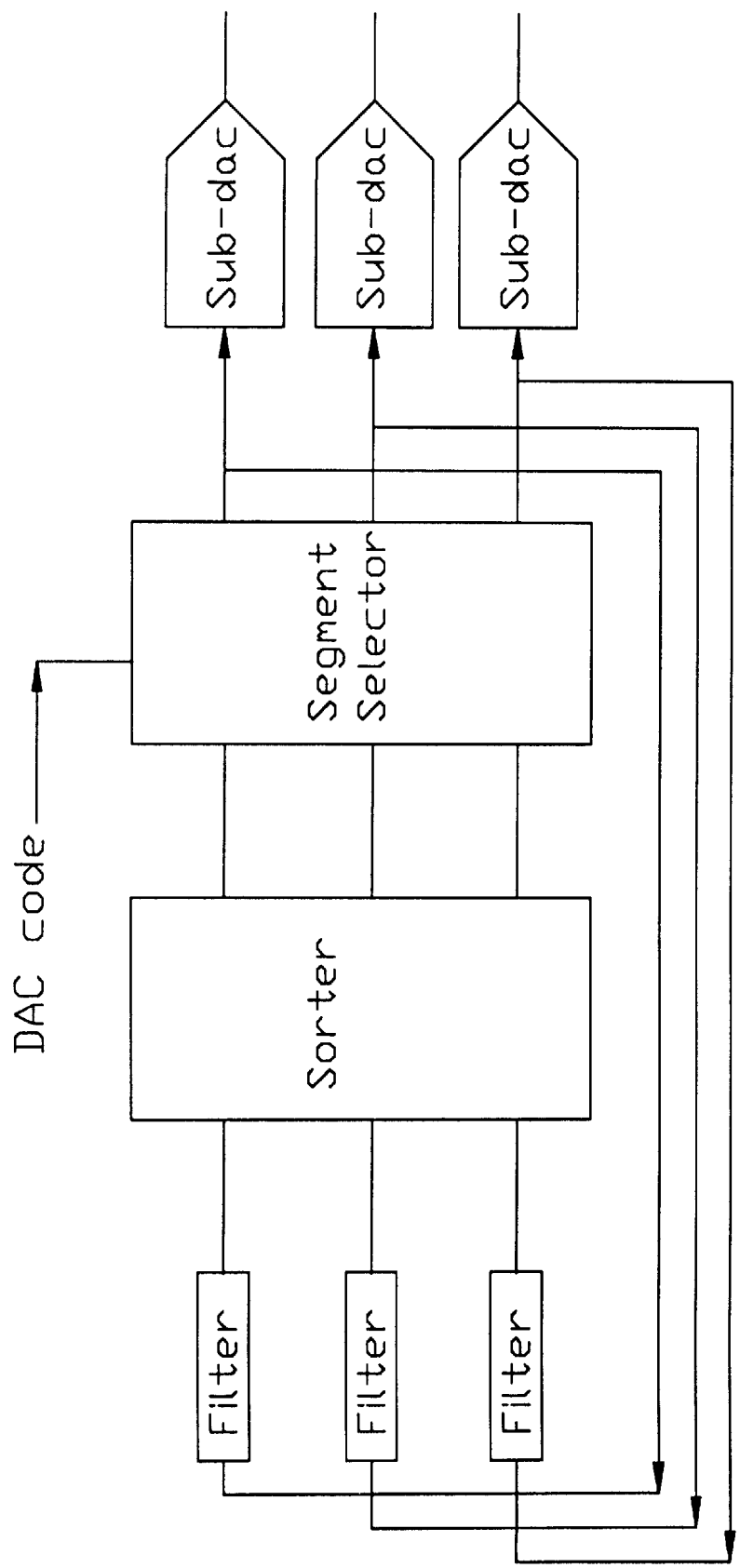
FIG. 4 shows one embodiment of DAC structure according to the invention.

The basic structure for a first embodiment of DAC mismatch error noise shaper according to the invention is shown in FIG. 4.

All the extra components required for noise shaping are digital. The input to the circuit is the digital DAC code. This input may be considered as an instruction for the number of DAC segments to be used. The outputs of the circuit are the individual analog segment outputs. There is an individual filter for each $S_i$. The filters are identical and have a passband at the same frequency range as the overall data converter.

For simplicity, the following discussion is restricted to low pass converters, so only lowpass filters are considered, but the invention is not restricted to such structures only. The outputs of the filters are fed to a sorter which orders the segments according to ascending filter output. The selector sets the individual sub-DAC (i.e. segment) control signals. The number of selected segments is determined by the digital DAC code input. In order to minimise the difference in segment control signals, those segments with lowest filter output values are selected in preference. The effect of the loop is to minimise the difference in filter outputs across the frequency spectrum. The low pass nature of the filters ensures that the difference in segment control signals is minimised at low frequency.

Thus in the system as illustrated in FIG. 4, the "K" factor or use of each sub-DAC, is monitored by the sorter. The ordering of the segments according to ascending filter output which is effected by the sorter brings about an adjustment or correction by which segments which are under-utilised are used more, so as to achieve the required equalisation over time. The sorter establishes therefore a ranking for use of the sub-DACs.

The technology described here differs from that described by Schreier R. and Zhang B. in "Noise-Shaped Multi-Bit D/A Converter Employing Unit Elements", Electronics Letter, September 1995, in two main respects. Firstly, a different topology is applied in a known circuit in which the input to the filter bank is a vector of quantisation errors. In contrast, the filter bank input in the present invention is the vector of segment control signals. Secondly, the known circuits give only very general descriptions of possible filter implementations, as compared with the specific filter structures now identified below.

To illustrate the method, a 3 bit sigma delta ($\Sigma \Delta$) ADC is simulated. The $4^{th}$ order modulator structure and integrator gains of the equivalent single bit converter are as described in C. Lyden, J.

Figure 5:
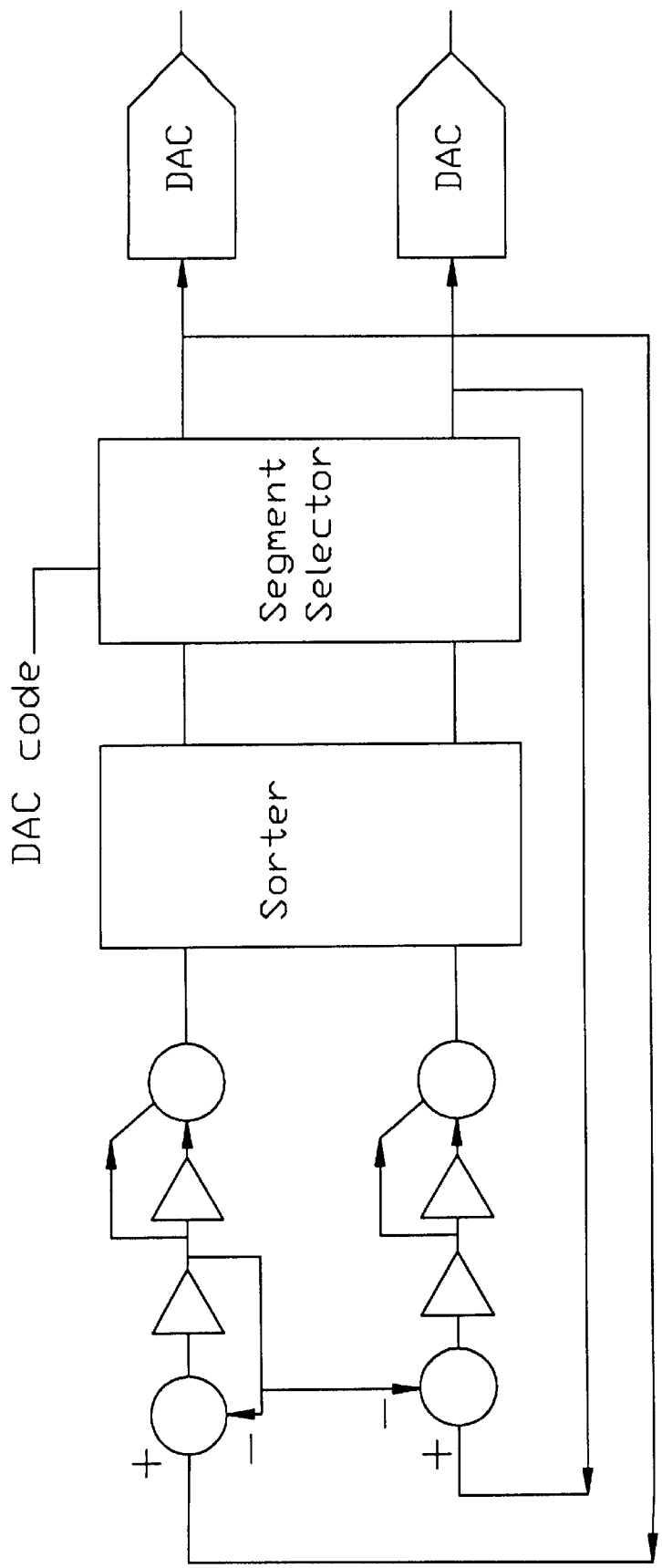
FIG. 5 shows the embodiment of FIG. 4 with two of the filter structures represented in detail.
Figure 6:
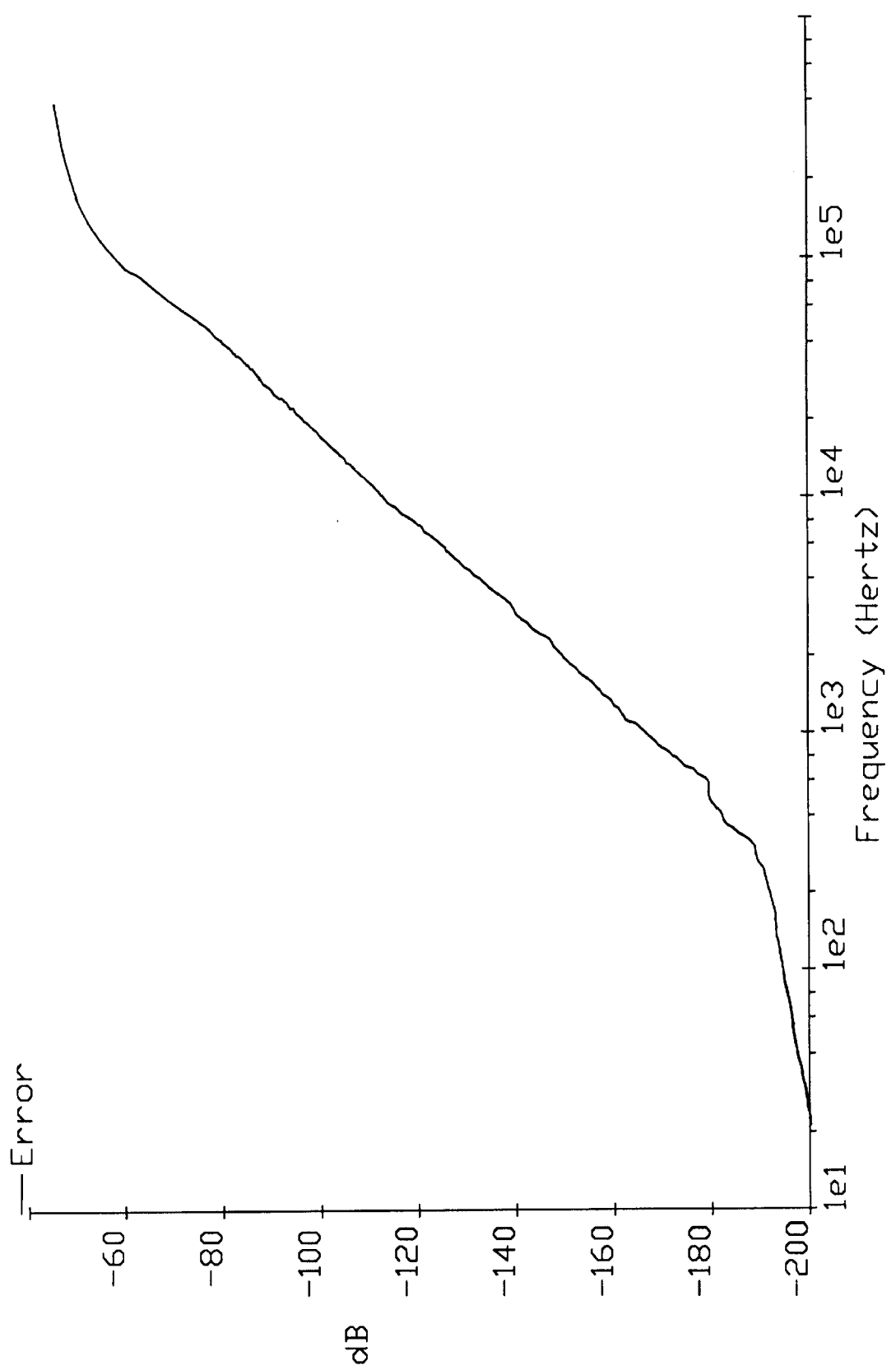
FIG. 6 shows the cumulative error with noise shaping according to the invention as provided by the embodiment of FIGS. 4 and 5.
Figure 7:
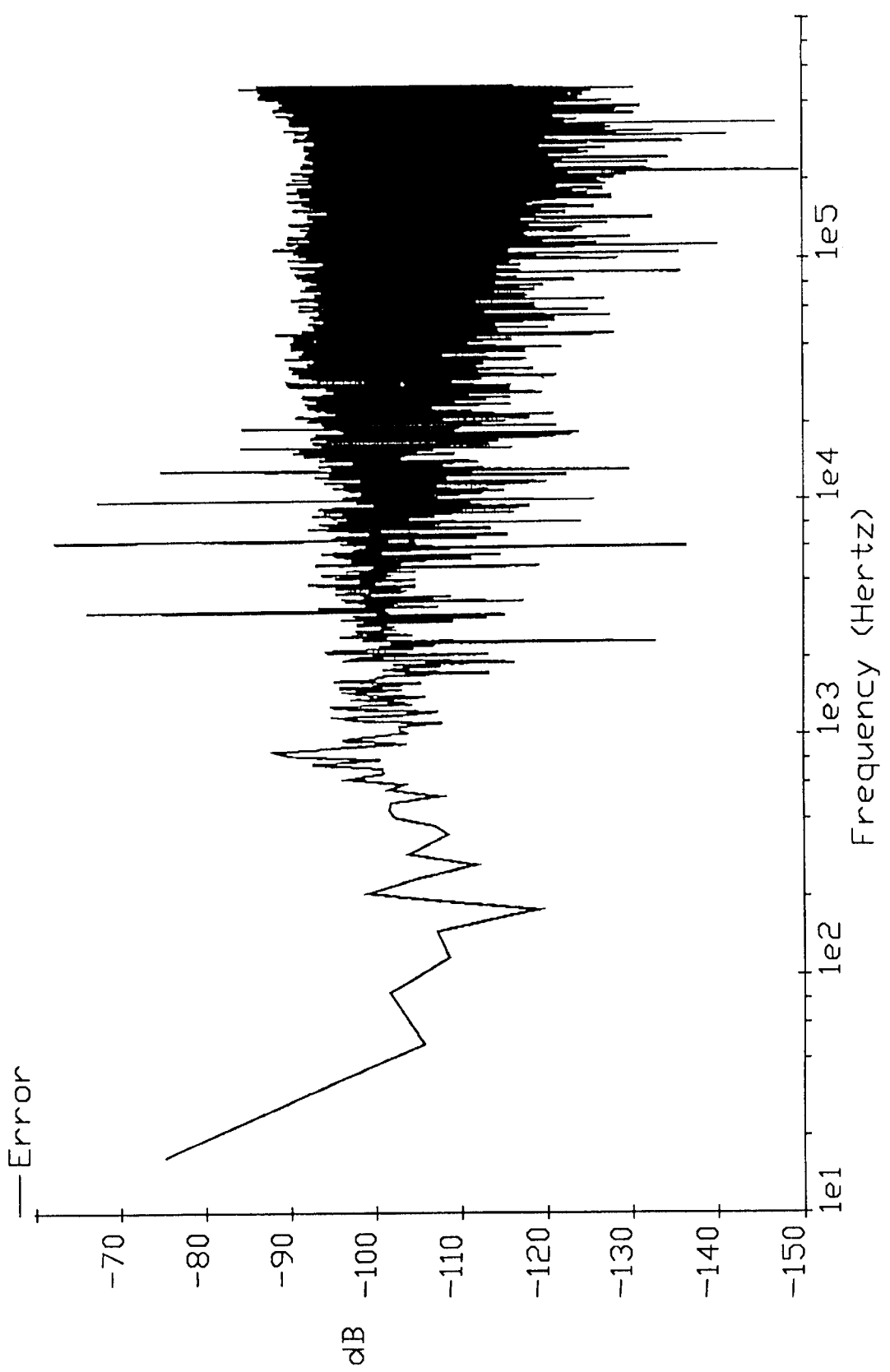
FIG. 7 shows the error which would be present if the invention as embodied in FIGS. 4 and 5 were not applied.

Ryan, C. A. Ugarte, J. J. Kornblum and Fan Ma, "A single shot sigma delta analog to digital converter for multiplexed applications", Proceedings of the Custom Integrated Circuits Conference, Santa Clara, May 1995. A seven segment DAC is used in the feedback path. The only circuit non-ideality in the simulation is that the segments mismatch to about 0.2%. FIG. 5 shows the filter bank used in the DAC error noise shaper, only two of the seven segments being however shown in the diagram. Each filter is second order infinite impulse response (IIR), from the general structure described in K. C.-H. Chao, S. Nadeem, W. L. Lee and C. H. Sodini, "A Higher Order Topology for Interpolative Modulators for Oversampling A/D Converters", IEEE Trans. Circuits & Sys. vol. CAS-37, pp. 309–318, March 1990. The gain of the $2^{nd}$ integrator in each filter is set to ¼, to assist loop stability. In order to keep the average values of the filter outputs small, the top segment is treated as a reference for the loop and its segment control signal value is subtracted from all the filter inputs. It is noteworthy that the integrator word widths may be quite small. In this simulation, the first integrator is implemented as a 2 bit updown counter and the second integrator as a 4 bit updown counter. FIG. 6 shows the simulated cumulative DAC error plotted against frequency. It may be seen that the error is very small at low frequencies and that a slope of 50 dB/decade is achieved. As a comparison, FIG. 7 is the error without noise shaping.

It is clear that alternative filters can be used to achieve alternative shaping of the DAC error, as required. The aspect that is common to all of the implementations is that a combined sorter and selector act to minimise the filtered differences between the segment control signals. Different filters may then be used to select which frequencies are to be kept clear of DAC error.

Figure 8:
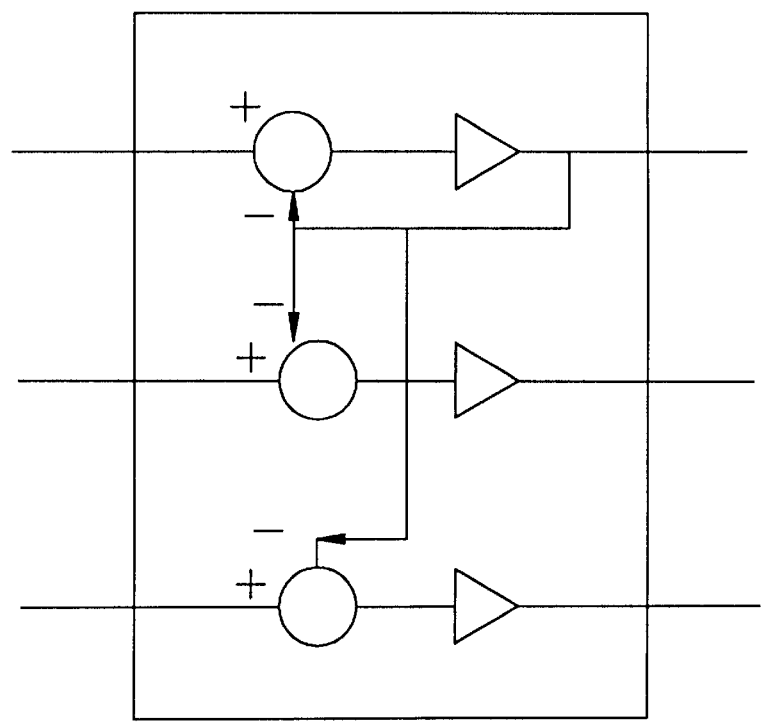
FIG. 8 shows a first order filter bank for use in a system embodying the invention.
Figure 9:
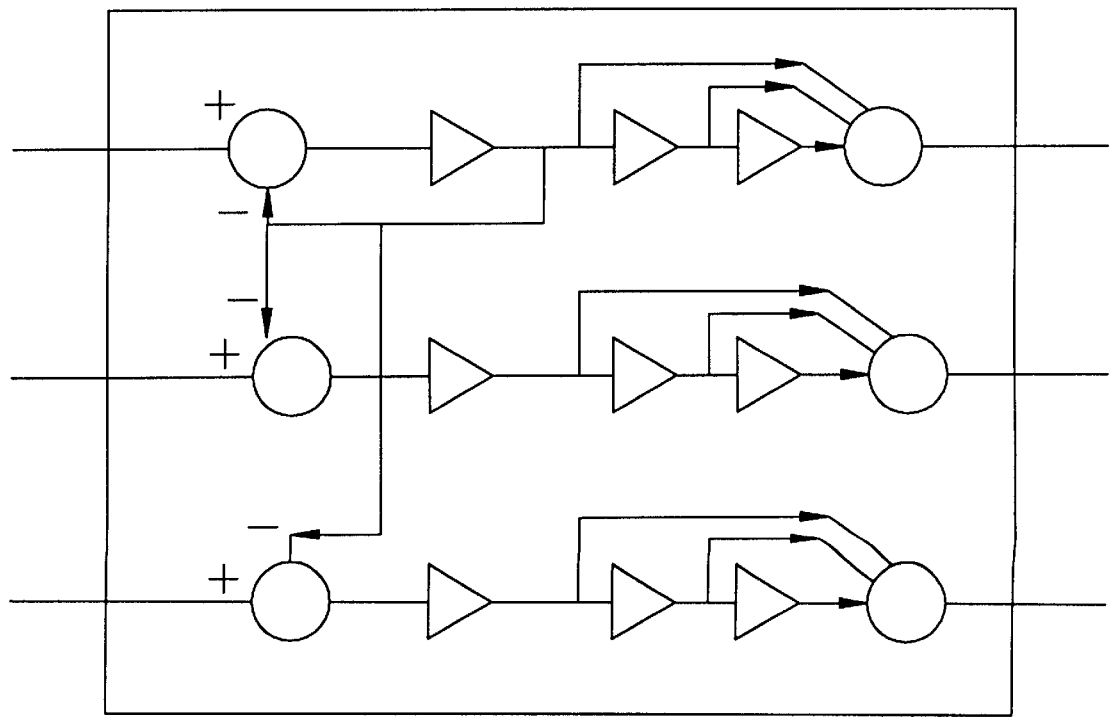
FIG. 9 shows a third order filter bank for use in a system according to the invention.

Alternative implementations include, but are not restricted to:

1) A first order filter bank, as illustrated in FIG. 8. This filter style is attractive for certain applications because of its simplicity.
2) A third order filter bank, as shown in FIG. 9, attractive for very high resolution applications because $3^{rd}$ order error shaping may be achieved. It may be noted that the choice of integrator gains has a strong influence on the stability of the overall loop. Gains of ¼ and ⅛ in the second and third integrators, respectively, appear to give a good margin of stability. The gain of the first integrator in this particular filter configuration does not affect stability.

Figure 10:
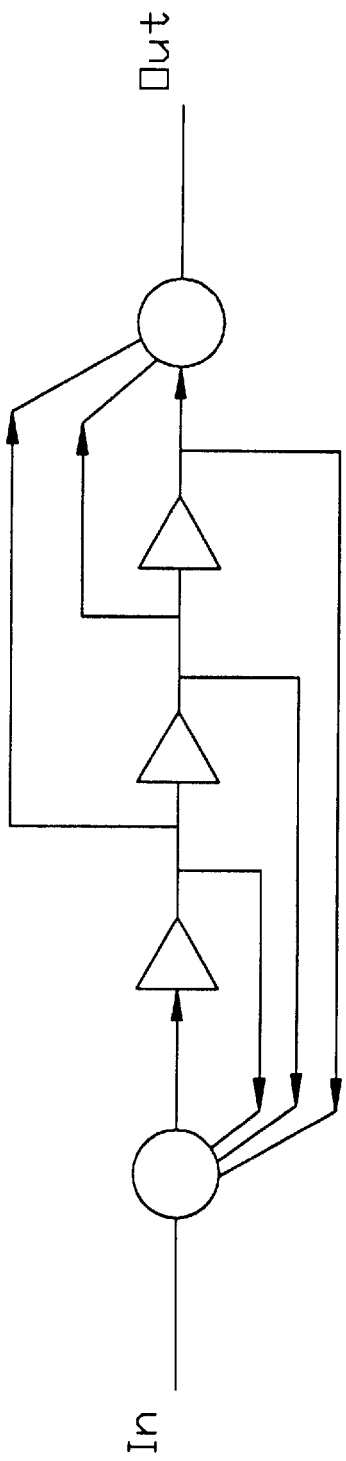
FIG. 10 is a representation of a generalised filter bank embodying the principles of the invention.
Figure 11:
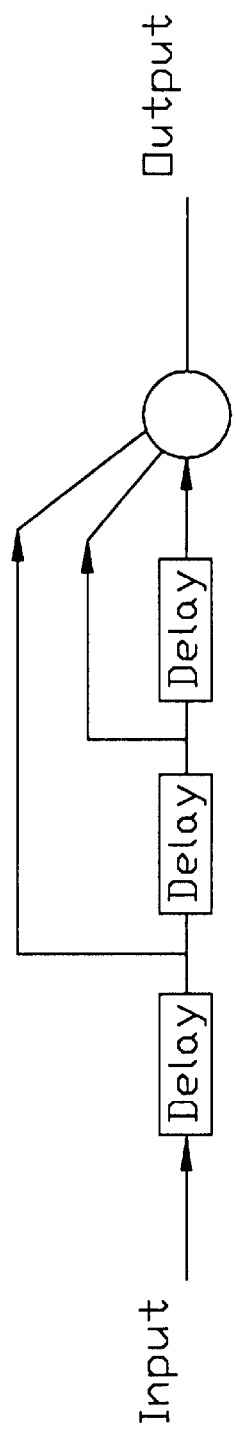
FIG. 11 is a representation of a generalised finite impulse response structure for use in a system according to the invention.

3) A generalised filter bank, illustrated in FIG. 10. Three integrators are shown in the diagram, but an arbitrary number may be included.
4) An FIR (finite impulse response) filter bank, shown in FIG. 11. The diagram illustrates a three tap filter, but any number of delays and taps may be used.
5) A bandpass filter bank to shape the mismatch error away from a passband which does not include dc. Such an implementation is appropriate where the overall data converter is intended for bandpass applications.

For simplicity, the above description of a means for reducing mismatch errors in multisegment DACs has considered the case where the analog outputs of the segments all have the same polarity. In certain circumstances, for instance where a data converter uses fully diferential circuitry, the designer may require that certain DAC segments have a positive polarity and other segments have a negative polarity. In that case, two independent error reduction means can be employed, one each for the positive and negative segment groups.

We claim:

1. A data conversion system comprising a segmented digital to analog converter for converting digital input data to an analog output over a predetermined frequency range, the segmented digital to analog converter having a plurality of digital to analog sub-converters each responsive to a respective segment control signal, and the system further comprising means for displacing error signals arising from mismatch between the digital to analog sub-converters to a frequency outside said predetermined frequency range, wherein said error signal displacing means comprises a plurality of filter arrangements, each associated with a respective one of said digital to analog sub-converters, wherein the input to each filter arrangement is a respective segment control signal for the associated said digital to analog sub-converter, and the outputs from said filter arrangements provide a plurality of inputs to a segment selector for setting said segment control signals.

2. A data conversion system according to claim 1, wherein said data conversion system defines an analog to digital conversion system and said digital to analog converter defines an analog feedback path.

* * * * *